(12) United States Patent
Park

(10) Patent No.: US 7,989,264 B2
(45) Date of Patent: Aug. 2, 2011

(54) WARPAGE RESISTANT SEMICONDUCTOR PACKAGE AND METHOD FOR MANUFACTURING THE SAME

(75) Inventor: Chang Jun Park, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/848,472

(22) Filed: Aug. 2, 2010

(65) Prior Publication Data
US 2010/0317151 A1 Dec. 16, 2010

Related U.S. Application Data

(62) Division of application No. 12/044,420, filed on Mar. 7, 2008, now Pat. No. 7,795,718.

(30) Foreign Application Priority Data

Nov. 30, 2007 (KR) .................. 10-2007-0123758

(51) Int. Cl.
*H01L 21/00* (2006.01)
(52) U.S. Cl. ... 438/108; 438/33; 438/109; 257/E21.499; 257/E23.064; 257/E23.067; 257/E23.085; 257/E23.18; 257/E23.19
(58) Field of Classification Search .................. 438/108, 438/109, 33; 257/E21.499, E23.18, E23.19, 257/E23.064, E23.067, E23.085
See application file for complete search history.

(56) References Cited

U.S. PATENT DOCUMENTS

| 7,588,964 B2* | 9/2009 | Kwon et al. ............ 438/109 |
| 2006/0073637 A1* | 4/2006 | Yokoyama et al. ....... 438/109 |
| 2007/0210447 A1 | 9/2007 | Kinsley |
| 2008/0169545 A1 | 7/2008 | Kwon et al. |

FOREIGN PATENT DOCUMENTS

| KR | 1020020054476 A | 7/2002 |
| KR | 1020030013737 A | 2/2003 |
| KR | 10-0621438 B1 | 8/2006 |
| KR | 1020070112645 A | 11/2007 |

OTHER PUBLICATIONS

USPTO Office Action mailed Feb. 17, 2010 for U.S. Appl. No. 12/044,420.
USPTO Notice of Allowance mailed Jun. 1, 2010 for U.S. Appl. No. 12/044,420.

* cited by examiner

*Primary Examiner* — Long K Tran
(74) *Attorney, Agent, or Firm* — Ladas & Parry LLP

(57) ABSTRACT

A semiconductor package and a method for manufacturing the same is provided for minimizing or preventing warpage and twisting of semiconductor chip bodies as a result of thinning them during gringing. The semiconductor package includes a semiconductor chip body and a substrate. The semiconductor chip body has a first surface, a second surface facing away from the first surface, through-electrodes which pass through the semiconductor chip body and project from the second surface, and a warpage prevention part which projects in the shape of a fence along an edge of the second surface. The substrate has a substrate body and connection pads which are formed on an upper surface of the substrate body, facing the second surface, and which are connected with the projecting through-electrodes.

7 Claims, 5 Drawing Sheets

_US 7,989,264 B2_

WARPAGE RESISTANT SEMICONDUCTOR PACKAGE AND METHOD FOR MANUFACTURING THE SAME

CROSS-REFERENCE TO RELATED APPLICATIONS

The present application claims priority to Korean patent application number 10-2007-0123758 filed on Nov. 30, 2007, which is incorporated herein by reference in its entirety.

BACKGROUND OF THE INVENTION

The present invention relates to a semiconductor package and a method for manufacturing the same.

These days, technologies for semiconductor packages including semiconductor chips have been rapidly developed.

Since the semiconductor chip manufactured through a semiconductor chip manufacturing process has input and output terminals of a very fine size, it is difficult to directly mount the semiconductor chip to a printed circuit board, etc. Also, since the semiconductor chip is likely to break even by small shocks and/or vibrations, the semiconductor chip is generally packaged through a packaging process.

A semiconductor package having undergone the packaging process has input and output terminals, which are suitable for mounting to a printed circuit board, and does not easily break by externally applied shocks and/or vibrations.

Recently, a technique has been disclosed in the art, in which the rear surface of the wafer formed with a plurality of semiconductor chips is ground down in an effort to decrease the thickness of the semiconductor chips and to reduce the volume of semiconductor packages.

However, as the rear surface of the wafer is ground down and the thickness of the wafer or the semiconductor chips included in the wafer decreases, and as a result the wafer or the semiconductor chips are likely to be warped or twisted. Due to this fact, various other defects can arise as a result of this course of manufacturing a semiconductor package.

SUMMARY OF THE INVENTION

Embodiments of the present invention are directed to a semiconductor package which has a decreased thickness and which has a propensity to prevent being warped or twisted.

Also, embodiments of the present invention are directed to a method for manufacturing the semiconductor package.

The semiconductor package comprises a semiconductor chip having a semiconductor chip body which has a first surface and a second surface facing away from the first surface, through-electrodes which pass through the semiconductor chip body and project from the second surface, and a warpage prevention part which projects in the shape of a fence along an edge of the second surface; and a substrate having a substrate body and connection pads which are formed on an upper surface of the substrate body, facing the second surface, and are connected with the projecting through-electrodes.

The semiconductor chip body is located in a chip region, and the warpage prevention part is located along scribe line regions which are defined around the chip region.

A length of the through-electrodes, which project from the second surface, is substantially the same as a height of the warpage prevention part.

The warpage prevention part is intermittently formed on the second surface.

The through-electrodes projecting from the second surface include solder members.

At least two semiconductor chips are located on the substrate.

The semiconductor package may further comprises bonding pads located on the first surface with the through-electrodes respectively passing through the bonding pads.

The method for manufacturing the semiconductor package comprises the steps of preparing a semiconductor chip having a first surface, a second surface facing away from the first surface, and a chip region partitioned by scribe regions; forming through-electrodes which pass through the first surface and the second surface; selectively etching the chip region on the second surface of the semiconductor chip to project the through-electrodes and a warpage prevention part, corresponding to the scribe regions, from the etched second surface; and connecting the through-electrodes projecting from the second surface of the semiconductor chip and connection pads of a substrate, corresponding to the through-electrodes, using conductive members.

The step of forming the through-electrodes comprises the steps of defining grooves which pass through bonding pads formed to on the first surface and have a depth less than a thickness of the semiconductor chip; and filling the grooves with a metal.

Between the step of defining the grooves and the step of filling the grooves with the metal, the method may further comprise the step of forming a metal seed layer on inner surfaces of the grooves.

The step of projecting the warpage prevention part comprises the steps of grinding the second surface and exposing the through-electrodes; covering the scribe regions on the second surface with a photoresist pattern, and exposing the chip region on the second surface; and etching the chip region on the second surface using the photoresist pattern as an etch mask.

After the step of etching the chip region on the second surface, the photoresist pattern is removed from the second surface.

At least two semiconductor chips are stacked.

The semiconductor chips are individually parted from each other along the scribe regions.

DESCRIPTION OF SPECIFIC EMBODIMENTS

Figure 1:
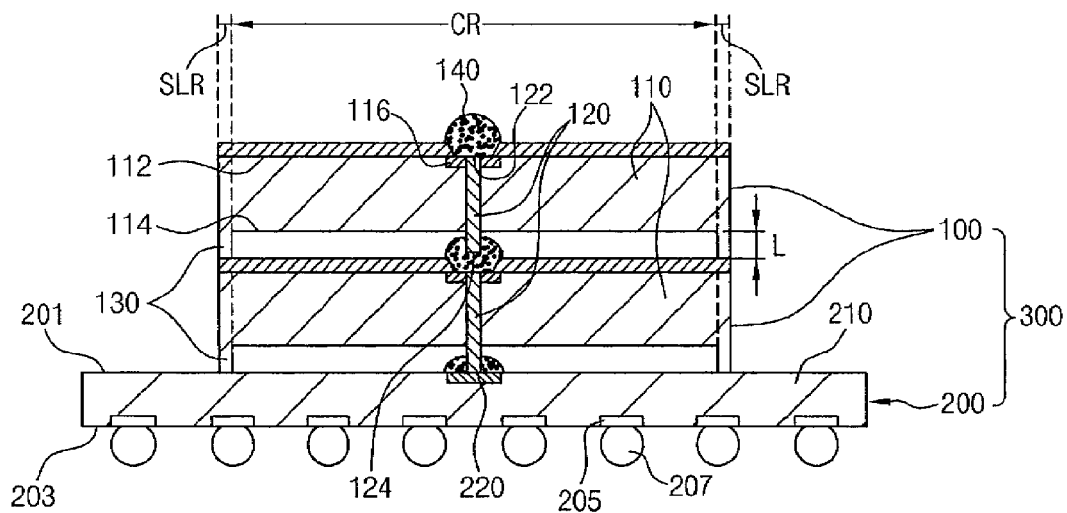
FIG. 1 is a cross-sectional view illustrating a semiconductor package in accordance with an embodiment of the present invention.
Figure 2:
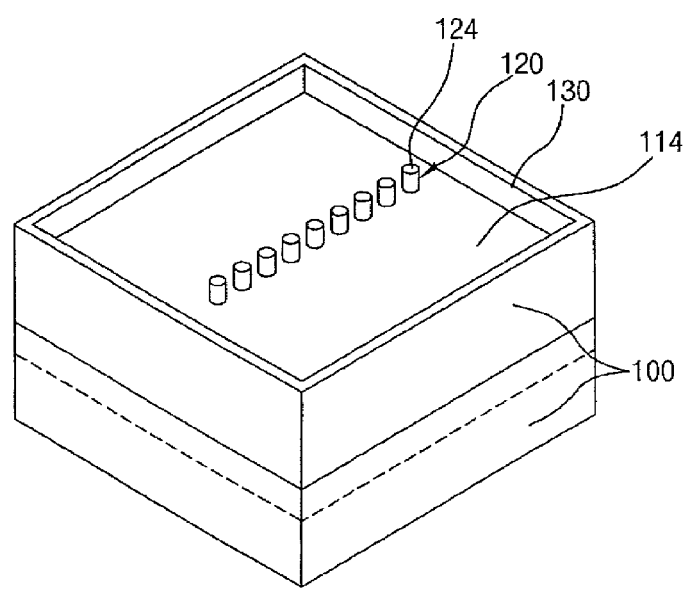
FIG. 2 is a perspective view illustrating the lower surface of the semiconductor chip shown in FIG. 1.

FIG. 1 is a cross-sectional view illustrating a semiconductor package in accordance with an embodiment of the present invention. FIG. 2 is a perspective view illustrating the lower surface of the semiconductor chip shown in FIG. 1.

Referring to FIGS. 1 and 2, a semiconductor package 300 includes semiconductor chips 100 and a substrate 200.

Each semiconductor chip 100 has a semiconductor chip body 110, through-electrodes 120, and a warpage prevention part 130. In addition, each semiconductor chip 110 can further have solder members 140 which are electrically connected with the through-electrodes 120.

The semiconductor chip body 110 has a first surface 112, a second surface 114, a circuit part (not shown), and bonding pads 116. The semiconductor chip body 110 is located, for example, in a chip region CR.

The semiconductor chip body 110 located in the chip region CR has, for example, the shape of a rectangular hexahedron. The first surface 112 of the semiconductor chip body 110 faces away from the second surface 114.

The circuit part is formed in the semiconductor chip body 110. The circuit part can include a data storage section for storing data and a data processing section for processing data.

The bonding pads 116 are located, for example, on the first surface 112 of the semiconductor chip body 110 in a plural number. The respective bonding pads 116 are electrically connected with the circuit part.

The bonding pads 116 can be arranged in line on the center portion of the first surface 112 or on the edge portions of the first surface 112. In the present embodiment, the bonding pads 116 are arranged, for example, on the center portion of the first surface 112.

The through-electrodes 120 pass through the bonding pads 116 which are formed on the first surface 112 of the semiconductor chip body 110 and portions of the semiconductor chip body 110 which correspond to the bonding pads 116. Unlike this, it can be envisaged that the through-electrodes 120 pass through other portions of the semiconductor chip body 110, which do not correspond to the bonding pads 116, and are connected with the bonding pads 116 via redistribution lines (not shown).

The through-electrodes 120 have the shape of a column. Each through-electrode 120 has a first end 122 which is formed on the first surface 112 and a second end 124 which faces away from the first end 122. The second end 124 of the through-electrode 120 projects from the second surface 114 by a predetermined length L.

As described above, the through-electrodes 120, which pass through the bonding pads 116 and the portions of the semiconductor chip body 110, can have the shape of a column. In the present embodiment, copper can be used as the material of the through-electrodes 120.

Meanwhile, a metal seed layer (not shown) can be applied to the surfaces of the through-electrodes 120. The exemplary materials for the metal seed layer can include titanium, nickel and vanadium.

The warpage prevention part 130 is formed in scribe line regions SLR which are defined around the chip region CR in which the semiconductor chip body 110 is located.

For example, the warpage prevention part 130 projects in the shape of a fence from the second surface 114 of the semiconductor chip body 110 in the scribe line regions SLR.

The warpage prevention part 130, which projects in the shape of a fence from the second surface 114 of the semiconductor chip body 110 in the scribe line regions SLR defining a quadrangular contour, prevents or suppresses the semiconductor chip body 110 from being warped by warping stress which is induced to warp or twist the semiconductor chip body 110.

Figure 3:
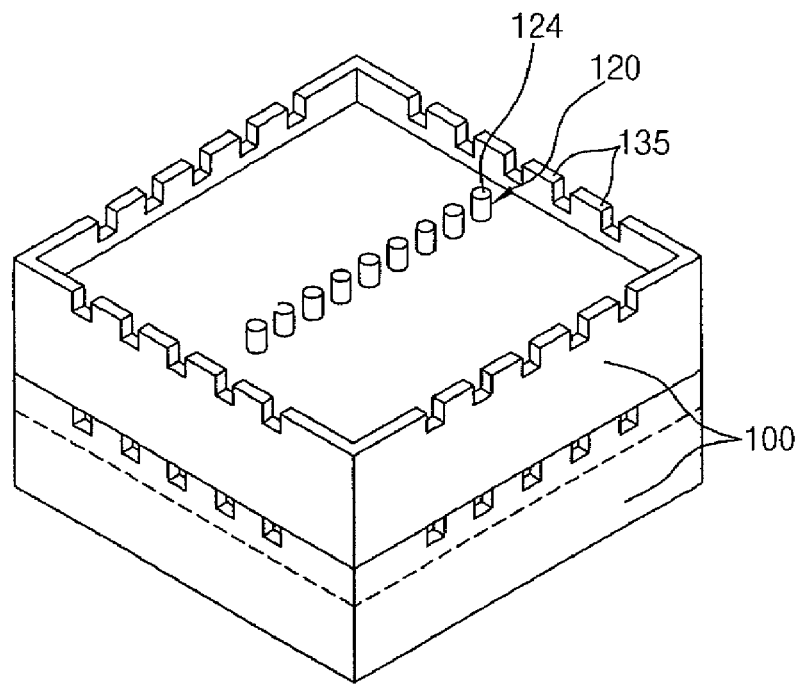
FIG. 3 is a perspective view illustrating a semiconductor package in accordance with another embodiment of the present invention.

Although it was described and illustrated in the present embodiment that the warpage prevention part 130 is formed in the shape of a fence in the scribe line regions SLR as shown in FIG. 2, unlike this, according to the present invention, a plurality of warpage prevention parts 135 can be intermittently located in the scribe line regions SLR as shown in FIG. 3.

The height of the warpage prevention part 130, which projects in the shape of a fence from the second surface 114 of the semiconductor chip body 110, is, for example, substantially the same as the length L by which the through-electrodes 120 project from the second surface 114 of the semiconductor chip body 110.

A plurality of semiconductor chips 100 can be stacked as shown in FIG. 1. At this time, the second surface 114 of an upper semiconductor chip 100 is located over the first surface 112 of a lower semiconductor chip 100, and due to this fact, the through-electrodes 120 of the upper semiconductor chip 100 face the bonding pads 116 of the lower semiconductor chip 100.

The solder members 140 electrically connect the bonding pads 116 of the lower semiconductor chip 100 with the second ends 124 of the through-electrodes 120 of the upper semiconductor chip 100, so that the plurality of semiconductor chips 100 can be stacked and be electrically connected with one another.

In order to electrically connect the plurality of semiconductor chips 100 with one another, the solder members 140 can be located on the bonding pads 116 of the respective semiconductor chips 100. Unlike this, the solder members 140 can be located on the second ends 124 of the through-electrodes 120 of the respective semiconductor chips 100.

The substrate 200 includes a substrate body 210 and connection pads 220.

The substrate body 210 has an upper surface 201 and a lower surface 203 which faces away from the upper surface 201.

The connection pads 220 are located on the upper surface 201 of the substrate body 210. The connection pads 220 are located at positions which correspond to the through-electrodes 120 projecting from the second surface 114 of the semiconductor chip 100.

In addition, the substrate 200 can further include ball land patterns 205 and solder balls 207 which are located on the lower surface 203 of the substrate body 210. The ball land patterns 205 are electrically connected with the connection pads 220 which are located on the upper surface 201 of the substrate body 210, and the solder balls 207 are electrically connected to the ball land patterns 205.

FIGS. 4 through 9 are cross-sectional views illustrating a method for manufacturing a semiconductor package in accordance with a still another embodiment of the present invention.

Figure 4:
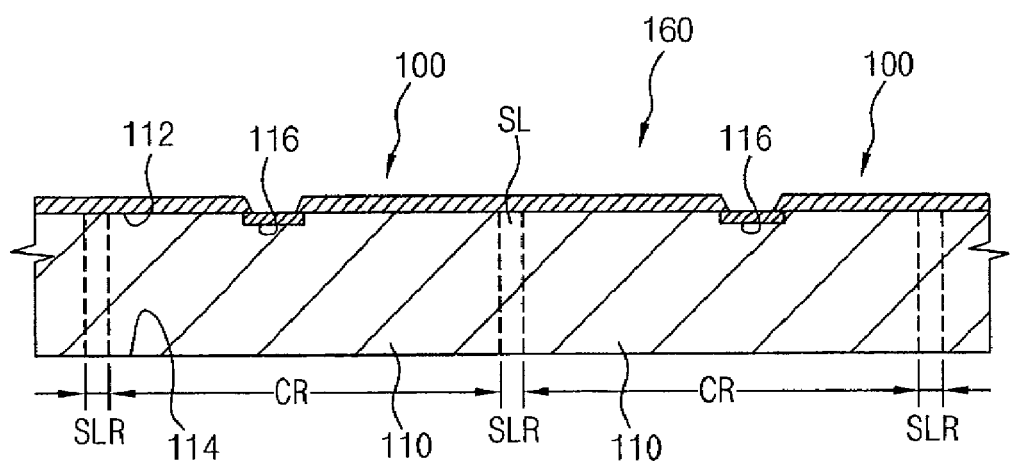
FIGS. 4 through 9 are cross-sectional views illustrating a method for manufacturing a semiconductor package in accordance with a still another embodiment of the present invention.

Referring to FIG. 4, in order to manufacture a semiconductor package, for example, a semiconductor chip 100 is first manufactured.

For example, a plurality of semiconductor chips 100 are formed on a wafer 160 in the type of a matrix through a semiconductor chip manufacturing process. Scribe lines SL are formed between semiconductor chips 100 such that the semiconductor chips 100 can be parted from the wafer 160 along the scribe lines SL.

Regions of the wafer 160, in which the semiconductor chips 100 are formed, are defined as chip regions CR, and regions of the wafer 160, in which the scribe lines SL for partitioning the chip regions CR are formed, are defined as scribe line regions SLR.

Each of the plurality of semiconductor chips 100 formed on the wafer 160 includes a semiconductor chip body 110. The semiconductor chip body 110 has a first surface 112 and a second surface 114 which faces away from the first surface 112.

Bonding pads 116, which are electrically connected with the circuit part (not shown) formed in the semiconductor chip body 110, are located on the first surface 112. For example, the bonding pads 116 can be arranged in line on the center portion of the first surface 112 of the semiconductor chip body 110 or on the edge portions of the first surface 112 of the semiconductor chip body 110. In the present embodiment, the bonding pads 116 are arranged, for example, on the center portion of the first surface 112 of the semiconductor chip body 110.

Figure 5:
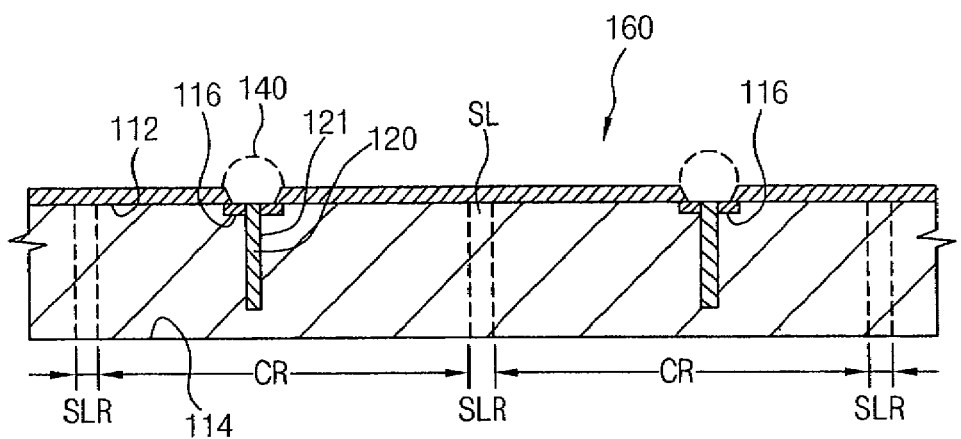
Figure 6:
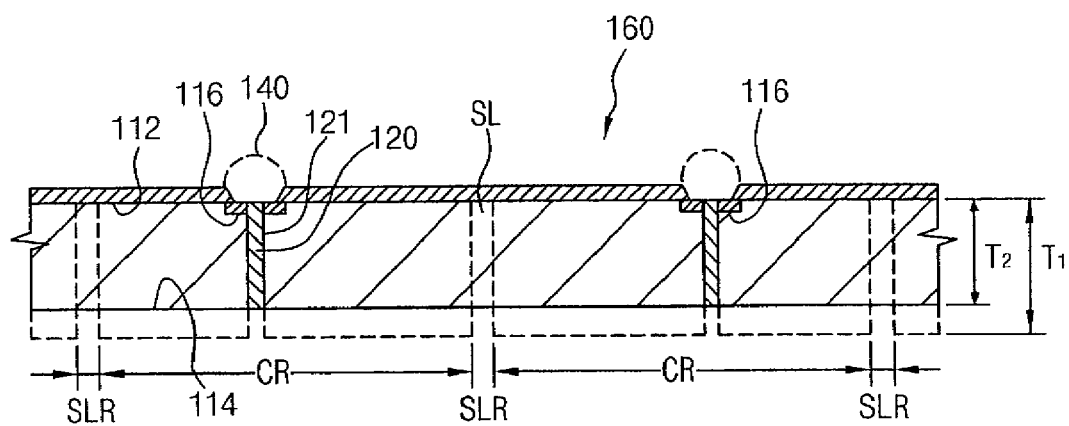

Referring to FIGS. 5 and 6, after the semiconductor chips 100 are manufactured, through-electrodes 120 are formed in each semiconductor chip body 110 in such a way as to pass through the first and second surfaces 112 and 114 of the semiconductor chip body 110.

Referring to FIG. 5, after the semiconductor chips 100 are manufactured, for example, grooves 121 to be used for forming through-electrodes are defined through the bonding pads 116 formed on the first surface 112 of each semiconductor chip 100 and in portions of the semiconductor chip 100 which correspond to the bonding pads 116. In the present embodiment, the depth of the grooves 121 is set to be less than the thickness of the semiconductor chip 100.

After the grooves 121 to be used for forming through-electrodes are defined in the semiconductor chip 100, a metal seed layer is formed on the inner surfaces of the grooves 121 to allow through-electrodes to be formed in the grooves 121 through a plating process.

The metal seed layer is a metal layer which has a small thickness. The exemplary metals, which can be used for forming the metal seed layer, can include titanium, nickel and vanadium.

After the metal seed layer is formed, the through-electrodes 120 having the shape of a column are formed in the grooves 121 through a plating process. Copper can be used for forming the through-electrodes 120.

After the through-electrodes 120 are formed, solder members 140 such as solder balls can be formed on the bonding pads 116 which are formed on the first surface 112 of the semiconductor chip body 110.

Referring to FIG. 6, after the through-electrodes 120 are formed, in order to reduce the volume of a semiconductor package, the second surface 114 of the semiconductor chip body 110 is grinded through a grinding process, such that the thickness of the semiconductor chip body 110 measured between the first surface 112 and the second surface 114 decreases from T1 to T2.

In FIG. 6, as the second surface 114 of each semiconductor chip body 110 is grinded through the grinding process, warpage or twisting can occur in the wafer 160 having the semiconductor chips 100. The warpage and twisting of the wafer 160 occurs in proportion to the thickness of the semiconductor chip body 110 to be grinded.

Figure 7:
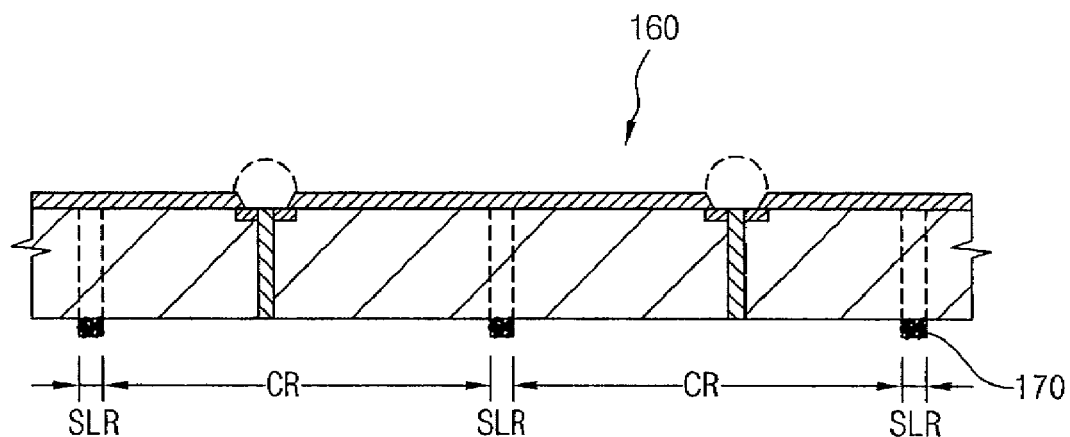

Referring to FIG. 7, in order to minimize, suppress or prevent the warpage and twisting of the semiconductor chip body 110 even with the grinding of the second surface 114 of the semiconductor chip body 110, a photoresist film (not shown) is to formed on the entire area of the second surface 114 of the grinded semiconductor chip body 110. The photoresist film can be formed, for example, through a spin coating process.

The photoresist film applied to the second surface 114 of the grinded semiconductor chip body 110 is patterned through a photo process including a lithography process and a development process, and through this, a photoresist pattern 170 is formed on the second surface 114 of the semiconductor chip body 110 in correspondence with the scribe line regions SLR.

Figure 8:
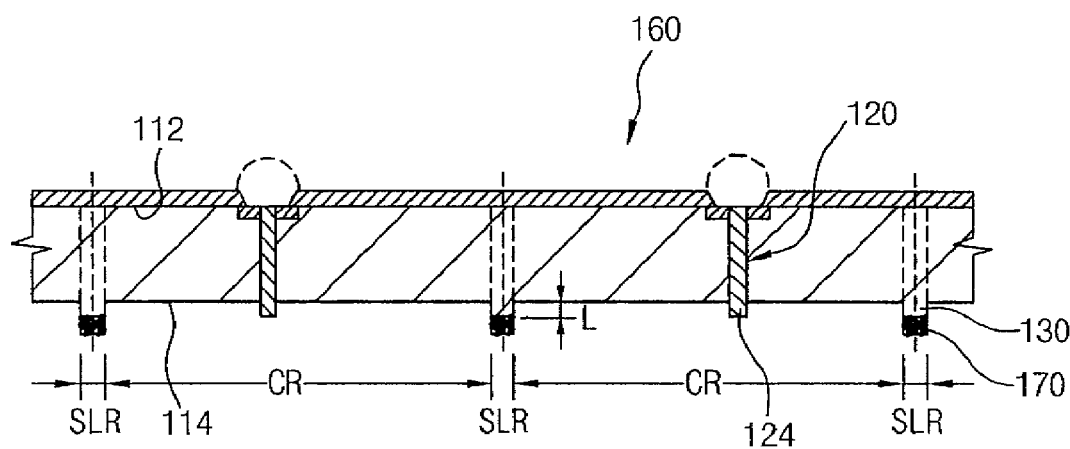

Referring to FIG. 8, after the photoresist pattern 170 is formed on the second surface 114 of the semiconductor chip body 110, the second surface 114 of the semiconductor chip body 110 is etched using the photoresist pattern 170 as an etch mask, and thereby, a warpage prevention part 130, which projects from the second surface 114, is formed on the second surface 114 of the semiconductor chip body 110 along the scribe line regions SLR.

After the warpage prevention part 130 is formed on the second surface 114 of each semiconductor chip body 110, the photoresist pattern 170 is removed from the second surface 114 through an ashing process or a stripping process.

The warpage prevention part 130 is formed along the scribe line regions SLR, and as a result of this, when viewing the wafer 160 from the top, warpage prevention parts 130 define the shape of a lattice. Due to the presence of the warpage prevention parts 130, the warpage of the wafer 160 and the semiconductor chips 100 formed on the wafer 160 is prevented.

As the scribe line regions SLR are cut by a sawing machine, the plurality of semiconductor chips 100, which are formed on the wafer 160, are individually parted. Although the parted semiconductor chips 100 have a small thickness, they have the warpage prevention parts 130. Therefore, even though the plurality of semiconductor chips 100 are parted from the wafer 160, the warpage and twisting of the semiconductor chips 100 is minimized, suppressed or prevented due to the presence of the warpage prevention parts 130.

Figure 9:
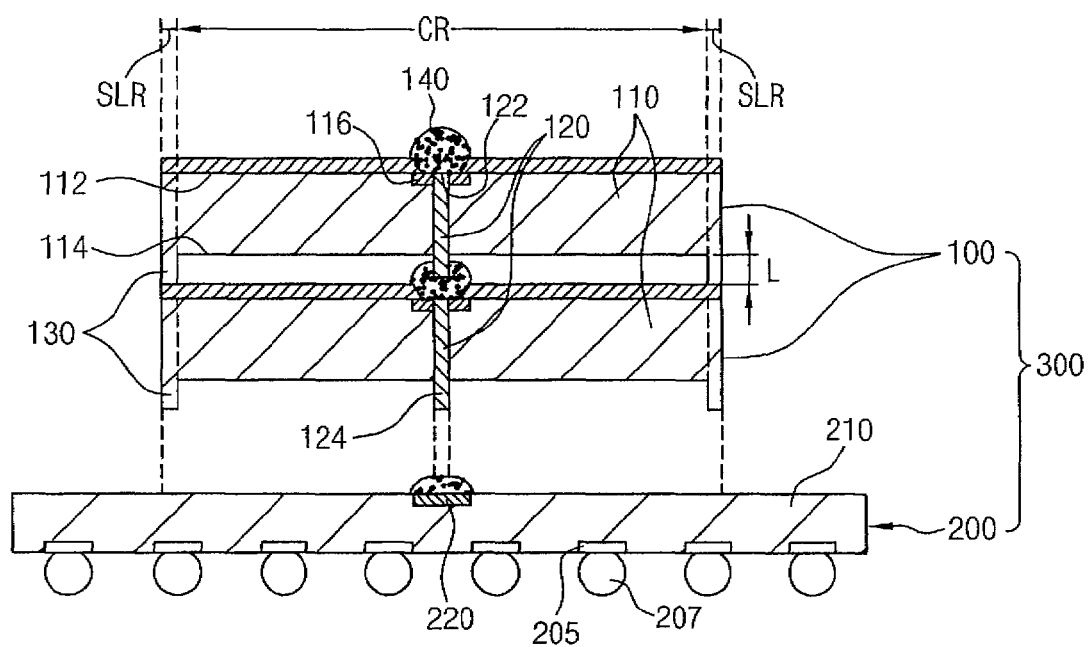

Referring to FIG. 9, at least two of the semiconductor chips 100 parted from the wafer 160 are stacked, and the stacked semiconductor chips 100 are electrically connected with each other by the solder members 140.

At least two stacked semiconductor chips 100 are located on the substrate body 210 of the substrate 200 having the connection pads 220 on which solder members are formed, and the through-electrodes 120 of the semiconductor chip 100 are electrically connected with the solder members formed on the connection pads 220, whereby the manufacture of a semiconductor package 300 as shown in FIG. 9 is completed.

As is apparent from the above description, in the present invention, after a plurality of semiconductor chips are formed on a wafer, the rear surface of the wafer is grinded to reduce the volume of the semiconductor chips, and warpage prevention parts are formed on the rear surface of the grinded wafer, whereby it is possible to minimize, suppress or prevent the wafer or the semiconductor chips formed on the wafer from being warped and twisted.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor package, comprising the steps of:
preparing a semiconductor chip having a first surface, a second surface facing away from the first surface, and a chip region partitioned by scribe regions;
forming through-electrodes which pass through the first surface and the second surface;
selectively etching the chip region on the second surface of the semiconductor chip and to project the through-electrodes and a warpage prevention part, corresponding to the scribe regions, from the etched second surface; and connecting the through-electrodes, projecting from the second surface of the semiconductor chip, with the connection pads of a substrate, corresponding to the through-electrodes, using conductive members.

2. The method according to claim 1, wherein the step of forming the through-electrodes comprises the steps of:
defining grooves which pass through bonding pads formed on the first surface and have a depth less than a thickness of the semiconductor chip; and
filling the grooves with a metal.

3. The method according to claim 2, wherein, between the step of defining the grooves and the step of filling the grooves with the metal, the method further comprises the step of forming a metal seed layer on inner surfaces of the grooves.

4. The method according to claim 2, wherein the step of etching the chip region to project the warpage prevention part comprises the steps of:

grinding the second surface and exposing the through-electrodes;
covering the scribe regions on the second surface using a photoresist pattern, and exposing the chip region on the second surface; and
etching the chip region on the second surface using the photoresist pattern as an etch mask.

5. The method according to claim 4, wherein, after the step of etching the chip region on the second surface, the photoresist pattern is removed from the second surface.

6. The method according to claim 1, wherein at least two semiconductor chips are stacked.

7. The method according to claim 6, wherein the semiconductor chips are individually parted from each other along the scribe regions.

* * * * *